United States Patent
Chen et al.

(10) Patent No.: US 10,438,864 B2
(45) Date of Patent: Oct. 8, 2019

(54) CIRCUIT PACKAGES COMPRISING EPOXY MOLD COMPOUNDS AND METHODS OF COMPRESSION MOLDING

(71) Applicant: Hewlett-Packard Development Company, L.P., Houston, TX (US)

(72) Inventors: Chien-Hua Chen, Corvallis, OR (US); Michael W. Cumbie, Corvallis, OR (US); Stephen Farrar, Corvallis, OR (US)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 0 days.

(21) Appl. No.: 15/745,743

(22) PCT Filed: Aug. 21, 2015

(86) PCT No.: PCT/US2015/046265
§ 371 (c)(1),
(2) Date: Jan. 18, 2018

(87) PCT Pub. No.: WO2017/034515
PCT Pub. Date: Mar. 2, 2017

(65) Prior Publication Data
US 2018/0226316 A1    Aug. 9, 2018

(51) Int. Cl.
*H01L 23/552*    (2006.01)
*H01L 23/48*    (2006.01)
(Continued)

(52) U.S. Cl.
CPC .......... *H01L 23/3135* (2013.01); *B41J 2/155* (2013.01); *H01L 23/3737* (2013.01);
(Continued)

(58) Field of Classification Search
CPC ............. H01L 23/3135; H01L 23/3737; H01L 23/295; H01L 21/561–565;
(Continued)

(56) References Cited

U.S. PATENT DOCUMENTS 5,679,975 A    10/1997   Wyland et al.
5,793,118 A *  8/1998   Nakajima ............. H01L 21/565
                                                 257/706

(Continued)

FOREIGN PATENT DOCUMENTS

JP    9321182    12/1997

OTHER PUBLICATIONS

Fu, Y-X. et al., "Thermal Conductivity Enhancement With Different Fillers For Epoxy Resin Adhesives CPA Patentability Search Report", Applied Thermal Engineering, May 2014. Retrieved from the internet:http://www.sciencedirect.com/science/article/pii/S1359431114001367, 2 pages.

*Primary Examiner* — Zandra V Smith
*Assistant Examiner* — Jeremy J Joy
(74) *Attorney, Agent, or Firm* — HP Inc. Patent Department

(57) ABSTRACT

A circuit package comprises a circuit device in a first epoxy mold compound and a second epoxy mold compound of different compositions.

17 Claims, 5 Drawing Sheets

(51) Int. Cl.
    *H01L 23/373* (2006.01)
    *H01L 23/31* (2006.01)
    *B41J 2/16* (2006.01)
    *B41J 2/155* (2006.01)

(52) U.S. Cl.
    CPC ............ *H01L 23/48* (2013.01); *H01L 23/552* (2013.01); *B41J 2/1623* (2013.01); *B41J 2/1637* (2013.01); *B41J 2202/20* (2013.01); *H01L 2924/181* (2013.01); *Y10T 29/49401* (2015.01)

(58) Field of Classification Search
    CPC ........... H01L 24/95–97; H01L 25/0655; H01L 25/042; H01L 25/072; H01L 25/0753; B41J 2/1623; B41J 2/1637; B41J 2202/20; Y10T 29/49401
    See application file for complete search history.

(56) References Cited

U.S. PATENT DOCUMENTS

| | | | | |
|---|---|---|---|---|
| 6,099,109 | A * | 8/2000 | Komuro | B41J 2/14024 347/50 |
| 6,154,366 | A * | 11/2000 | Ma | H01L 23/5389 257/700 |
| 6,188,414 | B1 * | 2/2001 | Wong | B41J 2/14024 347/42 |
| 6,331,052 | B1 * | 12/2001 | Murai | B41J 2/04581 347/10 |
| 6,417,026 | B2 * | 7/2002 | Gotoh | H01L 23/3135 257/E23.126 |
| 6,554,399 | B2 * | 4/2003 | Wong | B41J 2/14024 347/44 |
| 6,648,437 | B2 * | 11/2003 | Kawamura | B41J 2/14024 347/58 |
| 7,179,689 | B2 | 2/2007 | Matayabas et al. | |
| 7,766,455 | B2 * | 8/2010 | Graham | B41J 2/14024 347/47 |
| 8,083,314 | B2 * | 12/2011 | Goto | B41J 2/14024 347/29 |
| 8,231,204 | B2 * | 7/2012 | Jindai | B41J 2/14024 347/50 |
| 8,525,341 | B2 | 9/2013 | Kim et al. | |
| 8,881,387 | B2 | 11/2014 | Lin et al. | |
| 9,676,192 | B2 * | 6/2017 | Chen | B41J 2/155 |
| 9,768,038 | B2 * | 9/2017 | Lin | H01L 21/568 |
| 9,842,811 | B1 * | 12/2017 | Chou | H01L 23/3736 |
| 2002/0168798 | A1 * | 11/2002 | Glenn | H01L 21/56 438/113 |
| 2004/0032468 | A1 * | 2/2004 | Killmeier | B41J 2/1753 347/85 |
| 2006/0054901 | A1 * | 3/2006 | Shoji | H01L 21/565 257/80 |
| 2006/0065984 | A1 * | 3/2006 | Matayabas, Jr. | H01L 23/3128 257/790 |
| 2006/0066688 | A1 * | 3/2006 | Sugimoto | B41J 2/14233 347/68 |
| 2008/0061447 | A1 * | 3/2008 | Matayabas, Jr. | H01L 23/3121 257/777 |
| 2008/0272858 | A1 * | 11/2008 | Furihata | H03H 9/02984 333/193 |
| 2009/0108440 | A1 * | 4/2009 | Meyer | H01L 21/561 257/723 |
| 2009/0179317 | A1 * | 7/2009 | Iida | B81C 1/00238 257/685 |
| 2009/0244180 | A1 * | 10/2009 | Panchawagh | B41J 2/02 347/44 |
| 2009/0321912 | A1 * | 12/2009 | Watanabe | H01L 21/561 257/686 |
| 2010/0127340 | A1 * | 5/2010 | Sugizaki | B81B 7/007 257/415 |
| 2010/0184256 | A1 * | 7/2010 | Chino | H01L 21/561 438/118 |
| 2010/0320624 | A1 * | 12/2010 | Kang | H01L 21/568 257/787 |
| 2011/0049701 | A1 * | 3/2011 | Miyagawa | H01L 23/295 257/712 |
| 2011/0079816 | A1 * | 4/2011 | Fujioka | H01L 23/295 257/100 |
| 2011/0079929 | A1 * | 4/2011 | Matsuda | H01L 23/295 257/790 |
| 2011/0198115 | A1 * | 8/2011 | Azuma | H01L 23/3135 174/260 |
| 2011/0229708 | A1 * | 9/2011 | Asami | H01L 23/295 428/316.6 |
| 2012/0018858 | A1 * | 1/2012 | Chen | H01L 21/565 257/659 |
| 2012/0018884 | A1 * | 1/2012 | Lin | H01L 23/3107 257/738 |
| 2012/0104435 | A1 * | 5/2012 | Lee | H01L 33/54 257/98 |
| 2013/0082389 | A1 * | 4/2013 | Crisp | H01L 25/0655 257/773 |
| 2013/0113054 | A1 * | 5/2013 | Yow | H01L 23/3107 257/414 |
| 2013/0295725 | A1 * | 11/2013 | Park | H01L 24/19 438/124 |
| 2013/0337614 | A1 * | 12/2013 | Fuergut | H01L 23/3121 438/124 |
| 2014/0091460 | A1 * | 4/2014 | Lee | H01L 23/3128 257/737 |
| 2015/0049439 | A1 * | 2/2015 | Shimamura | H05K 1/0216 361/728 |
| 2015/0130045 | A1 * | 5/2015 | Tseng | H01L 23/36 257/712 |
| 2015/0318228 | A1 * | 11/2015 | Ito | H01L 21/563 257/789 |
| 2016/0035638 | A1 * | 2/2016 | Akiba | B32B 27/38 257/790 |
| 2016/0096366 | A1 * | 4/2016 | Chen | B41J 2/1404 347/44 |
| 2017/0334710 | A1 * | 11/2017 | Costa | B81C 1/0023 |

* cited by examiner

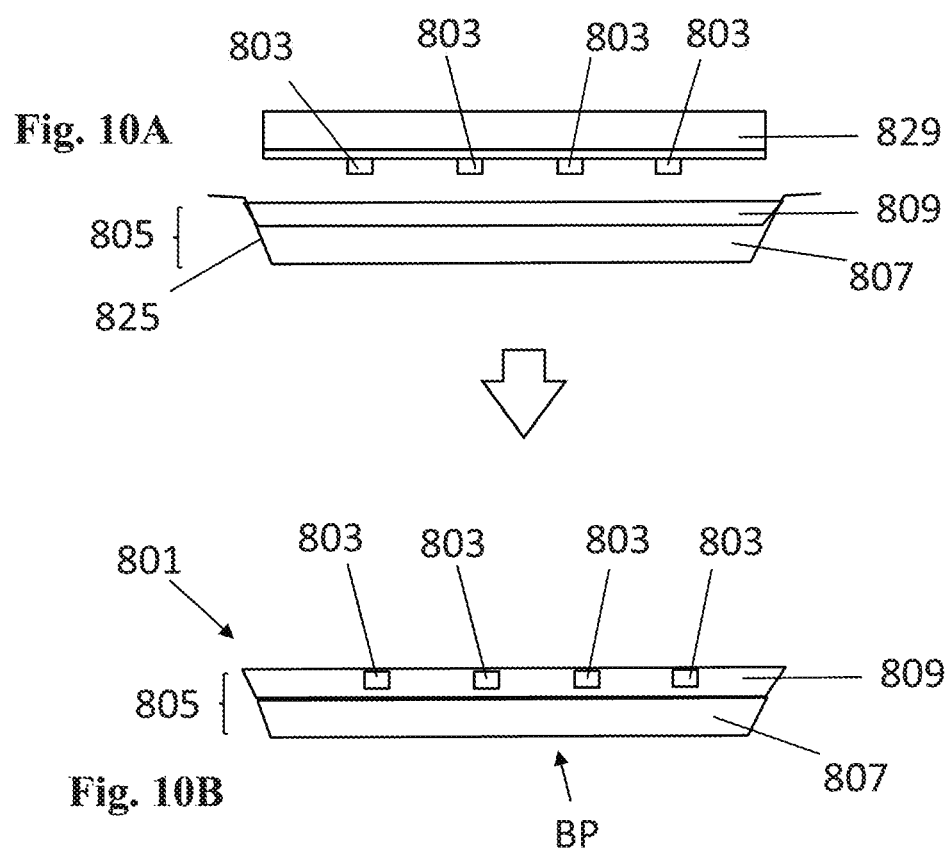

CIRCUIT PACKAGES COMPRISING EPOXY MOLD COMPOUNDS AND METHODS OF COMPRESSION MOLDING

BACKGROUND

Circuits such as integrated circuits are oftentimes packaged in an epoxy mold compound package to support and protect the circuitry. Depending on the manufacturing method used, it may be costly or challenging to add certain functionalities to packaged circuits.

BRIEF DESCRIPTION OF THE DRAWINGS

For the purpose of illustration, certain examples constructed in accordance with this disclosure will now be described with reference to the accompanying drawings, in which:

FIG. 10A illustrates a diagram of an example circuit and package materials before compression molding.

FIG. 10B illustrates a diagram of an example circuit package after compression molding the circuit and package materials of FIG. 10A.

DETAILED DESCRIPTION

In the following detailed description, reference is made to the accompanying drawings. The examples in the description and drawings should be considered illustrative and are not intended as limiting to the specific example or element described. Multiple examples can be derived from the following description and drawings through modification, combination or variation of the different elements.

Figure 1:
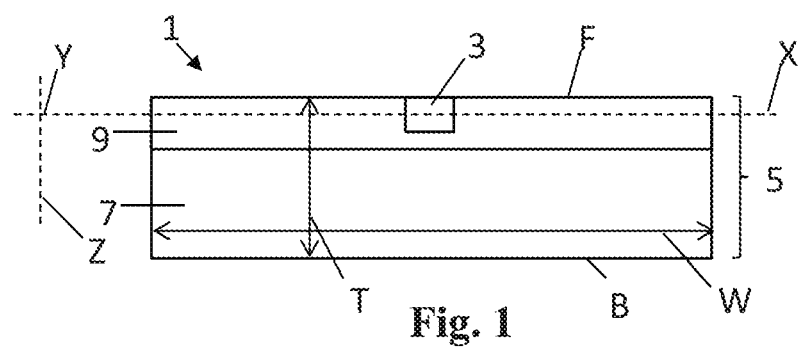
FIG. 1 illustrates a diagram of an example circuit package.

FIG. 1 illustrates an example of a circuit package 1. The circuit package 1 includes a circuit device 3 and a packaging 5. The packaging 5 serves to support and protect the circuit device 3. In an example additional circuitry may run through the packaging 5, connected to the circuit device 3. The packaging 5 comprises a first epoxy mold compound 7 and a second epoxy mold compound 9. As illustrated, the packaging 5 may be composed of layers of the first and second compound 7, 9. The first epoxy mold compound may be a bulk epoxy mold compound that is fills more than 50 vol. %, more than 60 vol. %, more than 70 vol. %, more than 80 vol. %, more than 90 vol. %, or more than 95 vol. % of the packaging 5. The first epoxy mold compound 7 can be a regular, relatively cost efficient epoxy mold compound 7. The second epoxy mold compound 9 has a different composition and added and/or different functional properties than the first epoxy mold compound 7.

In one example, the circuit package 1 is substantially panel-shaped. The panel-shaped circuit package 1 has a front surface F and a back surface B. Both the circuit device 3 and the second epoxy mold compound 9 extend near the front surface F. In the illustrated example, the second epoxy mold compound 9 extends in the same plane X-Y as the circuit device 3, wherein the plane X-Y extends parallel to the front and back surface F, B of the panel, and near the front surface F. In the illustrated example, the first epoxy mold compound 7 extends below the second epoxy mold compound 9 up to the back surface B.

The circuit package 1 has a panel shape in the sense that it has a thickness T, between a back and front surface B, F, that is much less than its width W or length. For example its thickness T can be at least five times, or at least ten times its width W and/or length (in the drawing, the length extends into the page). In the drawing, the thickness extends in a Z-direction while the length and width W extend in the X-Y plane.

The circuit device 3 may include metal and/or semi-conductor components. The semi-conductor components may include at least one of resistors, wiring, thin film layer structures and transistors such as FETs (Field Effect-Transistors), and wiring. Materials of the semi-conductor device 3 may include silicon and suitable semi-conductor and conductor materials. In one example, the circuit device 3 is a MEMS (Micro-Electric-Mechanic System) such as a thin sliver printhead die.

For example the bulk epoxy mold compound may provide for relatively large fluid channel paths while the circuit device 3 provides for microscopic fluid channels and driver circuitry. The second epoxy mold compound may be adapted with respect to regular epoxy mold compound to conduct heat or current away from the circuit device 3, for example by having conductive particles embedded. In another example, the second epoxy mold compound 9 is adapted to keep fluid away from the circuit device 3, for example after fluid ejection, by adding particles that provide for a low surface energy. In yet another example the second epoxy mold compound has a relatively high surface hardness. The second epoxy mold compound 9 may directly contact the circuit device 3 for example to aid in conducting heat or currents that pass through parts of the circuit device 3 and from there through the second epoxy mold compound 9.

In the thermally conductive example, the second epoxy mold compound 9 has a higher thermal conductivity than the first epoxy mold compound 7. The thermal conductivity of the second epoxy mold compound 9 may be obtained by adding thermally conductive particles to the second epoxy mold compound 9, such as Magnesium oxide, Aluminum nitride, Beryllium oxide, and other metal oxide fillers. In certain examples, the thermally conductive particles also have electrically conductive properties and the second epoxy mold compound 9 is both electrically and thermally conductive, as compared to the first epoxy mold compound 7. An example weight percentage of thermally conductive particles in the second epoxy mold compound 9 is between approximately 60 and 90 weight percentage In another example the second epoxy mold compound 9 has surface properties that are different than the first epoxy mold compound 7. For example, the second epoxy mold compound 9 has a different hardness than the first epoxy mold compound 7. The second epoxy mold compound 9 can be harder than the first epoxy mold compound 7, thereby providing for a relatively wear and deformation resistant front surface F of the circuit package 3. For example, the second epoxy mold compound 9 has at least one of ceramic, diamond, metal, dyes, mineral filler, and carbon nanotube particles embedded in order to obtain enhanced hardness. An example weight percentage of hardness inducing particles in the second epoxy mold compound 9 is between approximately 10 and 40 weight percentage.

In another example the second epoxy mold compound 9 has a different surface energy than the first epoxy mold compound 7. In one example, the second epoxy mold compound can have a relatively high surface energy. In the example that will be further elaborated here, the second epoxy mold compound 9 has a lower surface energy than the first epoxy mold compound 7. A relatively low surface energy may inhibit puddles on the front surface F of the circuit package 1, thereby generally aiding in controlling humidity and liquids near the circuit device 3. In different examples, particles that provide for a low surface energy include fluorinated polymer additives such as PTE, PEEK or others, or hydrophobic fumed silica or TEFLON®. An example weight percentage of low surface energy inducing particles in the second epoxy mold compound 9 is between approximately 10 and 90 weight percentage of the packaging 5.

In further examples, at least some of the mentioned properties can be combined in the second epoxy mold compound layer, for example by adding a mixture of said particles so as to provide for at least two of (i) thermally conductive properties, (ii) electrically conductive properties, (iii) a relatively high hardness, and (iv) a relatively low surface energy. In another example, the filler properties may also be adjusted. For example the second epoxy mold compound may include relatively smaller or finer fillers that may aid in achieving a more enhanced surface smoothness when removing holes, slots or channels in the compound, for example to create fluid channels, through laser ablation or other suitable remove techniques.

The example circuit packages 1 of this disclosures have added functionalities that are present in a relatively thin layer of a specially adapted second epoxy mold compound 9 that overlies a bulk layer of a first, regular epoxy mold compound. The adapted second epoxy mold compound 9 prevents the need to add separate components to the circuit package. Rather, these additional functions are integral to the circuit package 1 without adding much costs or complexity. The additional functions may be obtained without adding additional assembly or manufacturing steps to the compression mold manufacturing process of the package 1.

Figure 2:
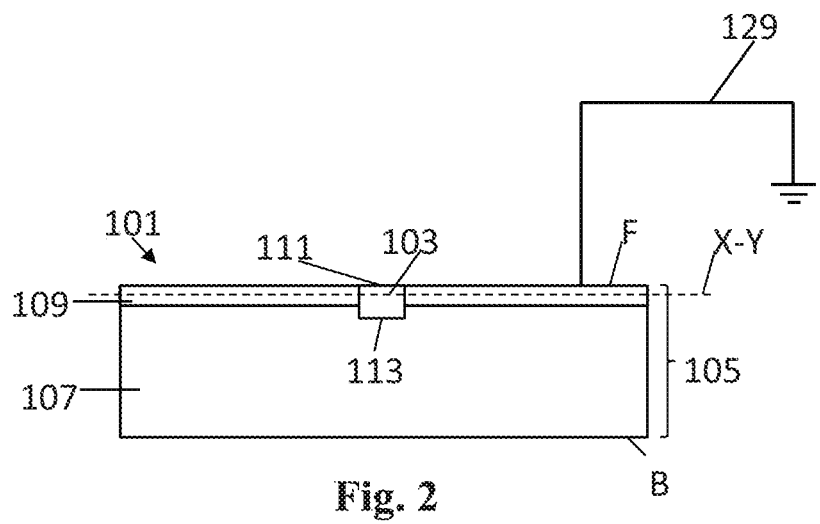
FIG. 2 illustrates a diagram of another example circuit package.

FIG. 2 illustrates another example circuit package 101. The circuit package 101 may be panel shaped and includes a packaging 105 and a circuit device 103. The circuit package 101 includes a relatively thin second layer of a second epoxy mold compound 109 that is disposed over a first layer of a first epoxy mold compound 107. The circuit device 103 extends in or near a front surface F. The second layer of the second epoxy mold compound 109 extends in the same plane X-Y as the circuit device 103. The plane X-Y extends parallel to the front surface F and a back surface B of the circuit package 101, near the front surface F. In one example, the first epoxy mold compound 107 forms the bulk of the packaging 105 and forms the back surface B of the packaging 105.

For example, the second epoxy mold compound 109 is electrically conductive and the first epoxy mold compound 107 is electrically insulating. The conductance of the second epoxy mold compound 109 can be 10 to 10^4 ohm/sq. The second epoxy mold compound 109 may have a grounding function. For example the second epoxy mold compound 109 is connected to a further ground circuit 129. In one example, the ground circuit 129 may include wiring and a bond pad or electrical connector, for example to connect to a frame or chasses of a further apparatus of which the circuit package 1 may be a component. In one example, the electrically conductive layer of the second epoxy mold compound 109 may function as an electromagnetic shield to protect portions of the circuit device 3.

In one example, the electrically conductive layer of the second epoxy mold compound 109 is relatively thin, for example thinner than 0.3 millimeter, thinner than 0.2 millimeter, thinner than 0.1 millimeter or thinner than 500 micron. The second epoxy mold compound 109 may include carbon-based conductive particles such as carbon nanotube and/or graphite, and others. An example weight percentage of electrically conductive particles that are added to the second epoxy mold compound 109 is between approximately 20 and 60 weight percentage of the packaging 105. The first epoxy mold compound 7 can be made of more regular, readily available compound that may have inherent electrically insulating properties.

In one example, the layer of the second epoxy mold compound 109 is thinner than a height of the circuit device 103 so that a front portion 111 of the circuit device 103 extends in the second epoxy mold compound 109 while a back portion 113 of the circuit device 103 extends in the first epoxy mold compound 107 that extends below the second epoxy mold compound 109. During compression molding, the circuit device 103 may be deposited into and partly through the second epoxy mold compound 109 so that the back portion 113 sits in the first epoxy mold compound 107.

Figure 3:
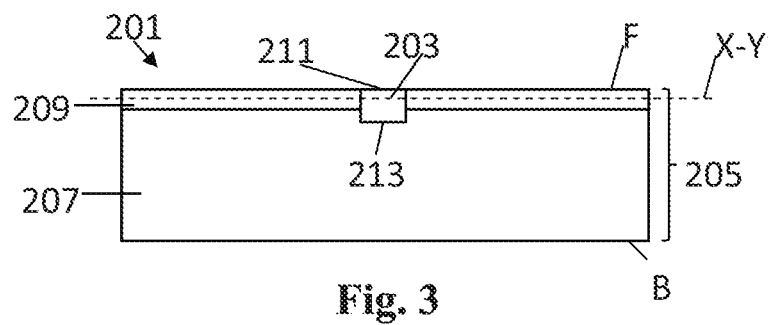
FIG. 3 illustrates a diagram of another example circuit package.

FIG. 3 illustrates another example of a circuit package 201 that has a thin top layer of a second epoxy mold compound 209. The dimensions of the circuit package 201 can be similar to the example of FIG. 2. The second epoxy mold compound 209 has certain surface properties that are different than the first epoxy mold compound layer 207. For example, the second epoxy mold compound 209 has a lower surface energy or enhanced hardness with respect to the first epoxy mold compound 207. In yet another example, the thin top layer of the second epoxy mold compound 209 has a higher thermal conductivity than the first epoxy mold compound 207. The second epoxy mold compound 209 is relatively thin, for example thinner than 0.3 millimeter, thinner than 0.2 millimeter, thinner than 0.1 millimeter or thinner than 500 micron. The second epoxy mold compound 209 may include either low surface energy inducing particles or hardness inducing particles. Examples of either of these particles are mentioned above in the description of FIG. 1. The first epoxy mold compound 207 can be made of more regular, readily available compound.

Figure 4:
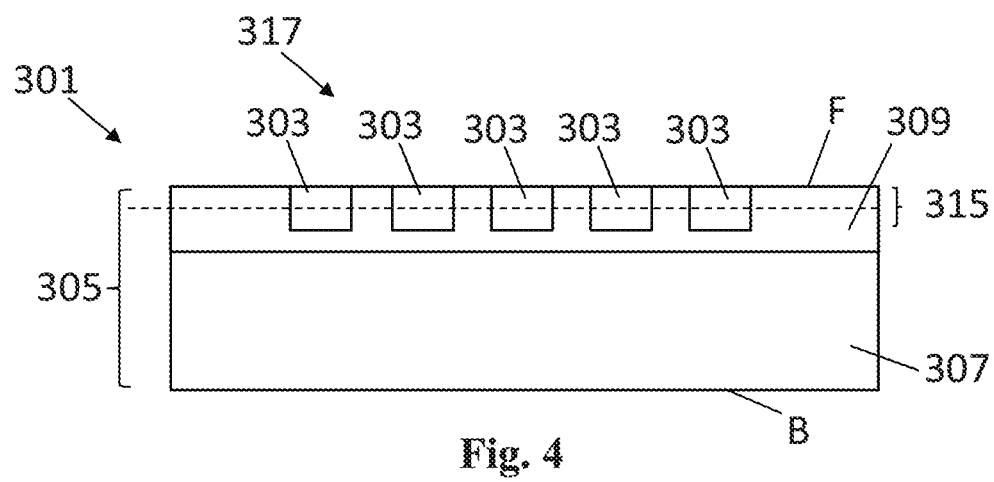
FIG. 4 illustrates a diagram of another example circuit package.

FIG. 4 illustrates an example of a circuit package 301, including a packaging 305 and a circuit device 303. The circuit package 301 includes an array 317 of circuit devices 303 in a circuit device layer 315. The circuit device layer 315 may be provided near a front surface F of the circuit package 301. The circuit device array 317 is composed of columns and/or rows of circuit devices 303. In the example, the circuit devices 303 extend up to the front surface F.

The packaging 305 includes a first epoxy mold compound 307 and a second epoxy mold compound 309 having different functional and compositional properties than the first epoxy mold compound 307, wherein these different functional properties may include heat conductivity, thermal conductivity, surface energy or hardness. In the illustrated example, the first epoxy mold compound 307 forms a back portion of the packaging 301 near a back surface B. The first epoxy mold compound 307 may form the bulk of the material of the packaging 305. The second epoxy mold compound 309 extends near the front surface F in the same plane X-Y as the circuit device array 317.

The circuit device array 317 may be applied to each of the examples of this description. For example, each of the individual circuit devices 3, 103, 203, of each of the examples of FIG. 1-3 could be an array 317 of circuit devices as in FIG. 4 wherein the array 317 extends in the respective first and/or second epoxy mold compound layer.

Figure 5:
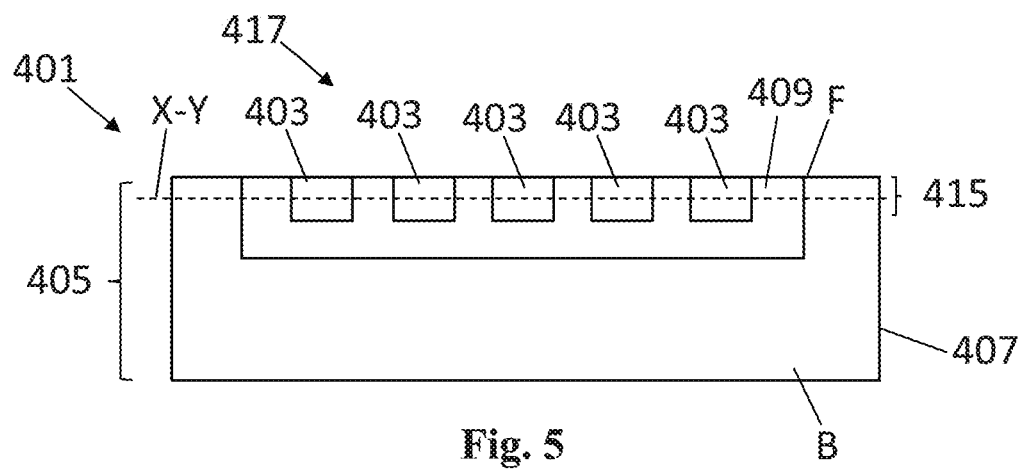
FIG. 5 illustrates a diagram of another example circuit package.

FIG. 5 illustrates another circuit package 401 that includes a circuit device array 417, similar to FIG. 4. Here the second epoxy mold compound 409 is patterned in the first epoxy mold compound 407. In the circuit device layer 415, the second epoxy mold compound 409 is provided adjacent the circuit devices 403 and omitted away from the circuit devices 403. The second epoxy mold compound 409 is surrounded by the first epoxy mold compound 407 in the circuit device layer 415. The front face F is formed by the first epoxy mold compound 407, the second epoxy mold compound 409, and the circuit devices 403.

Figure 6:
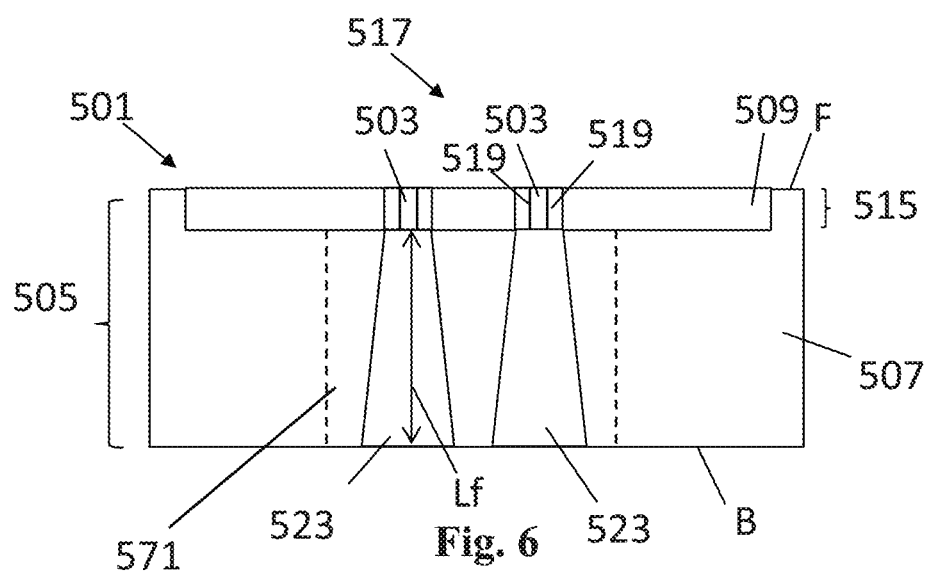
FIG. 6 illustrates a diagram of an example of a fluid circuit package in a cross sectional front view.
Figure 7:
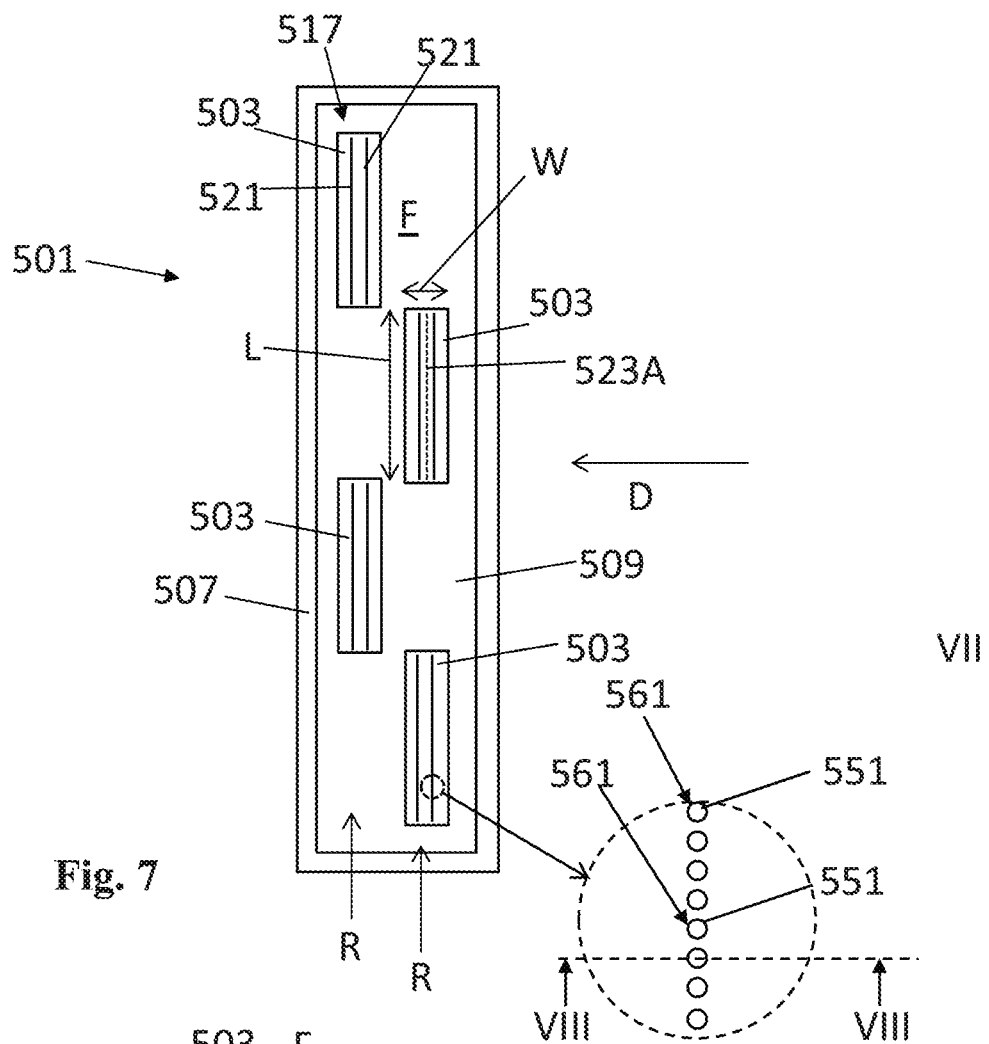
FIG. 7 illustrates a diagram of the fluid circuit package of FIG. 6 in a top view.
Figure 8:
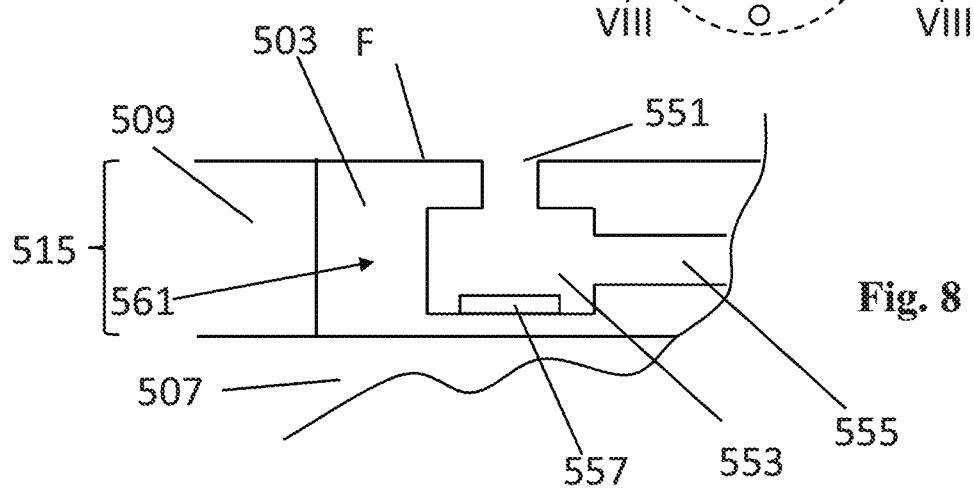
FIG. 8 illustrates an enlarged cross sectional view of a detail of the fluid circuit package of FIG. 7.

FIGS. 6 and 7 illustrate a panel-shaped fluidic circuit package 501 in a cross sectional side view and in a top view, respectively. FIG. 8 illustrates an enlarged view of a detail of the fluid circuit package 501. The fluidic circuit package 501 includes a packaging 505 of a first and second epoxy mold compound 507, 509, respectively, wherein the second epoxy mold compound 509 has a different composition than the first epoxy mold compound 507, as explained in more detail above with reference to FIG. 1. An array 517 of fluidic circuit devices 503 is disposed in a circuit device layer 515 near a front surface F. In this example the circuit device layer 515 defines the front surface F.

The fluid circuit package 501 may be a component of a high precision digital liquid dispensing module such as a media wide array print bar for two-dimensional or three-dimensional printing. The fluid circuit devices 503 may be shaped like relatively thin slivers, for example having a thickness of less than 2 millimeter, less than 1 millimeter or less than 500 micron. The circuit devices 3 may include silicon material. Each of the circuit devices 503 includes channels 519 of microscopic size to transport fluid (FIG. 8).

FIG. 8 illustrates a diagrammatic example of a nozzle 551, nozzle chamber 553, fluid inlet 555 and an actuator 557 of the circuit device 503. The fluid inlet 555 receives fluid from the fluid channel 519 (FIG. 6). The fluid channel 519 may transport the fluid to an array of nozzle chambers 553, for example through a common manifold connected to multiple inlets 555. The actuator 557 can be a piezo or thermal resistor. It may be connected to transistors and further drive circuitry to be actuated. Actuation causes fluid to expel through the nozzle 551. The assembly of the nozzle 551, nozzle chamber 553, fluid inlet 555 and actuator 557 may together be referred to as drop generator 561. Each fluid circuit device 503 includes at least one array of drop generators 561.

By way of illustration only it is shown that the circuit device 503 may contact the second epoxy mold compound 509 and that the circuit device layer 515 may extend above the first epoxy mold compound 507.

Figure 9:
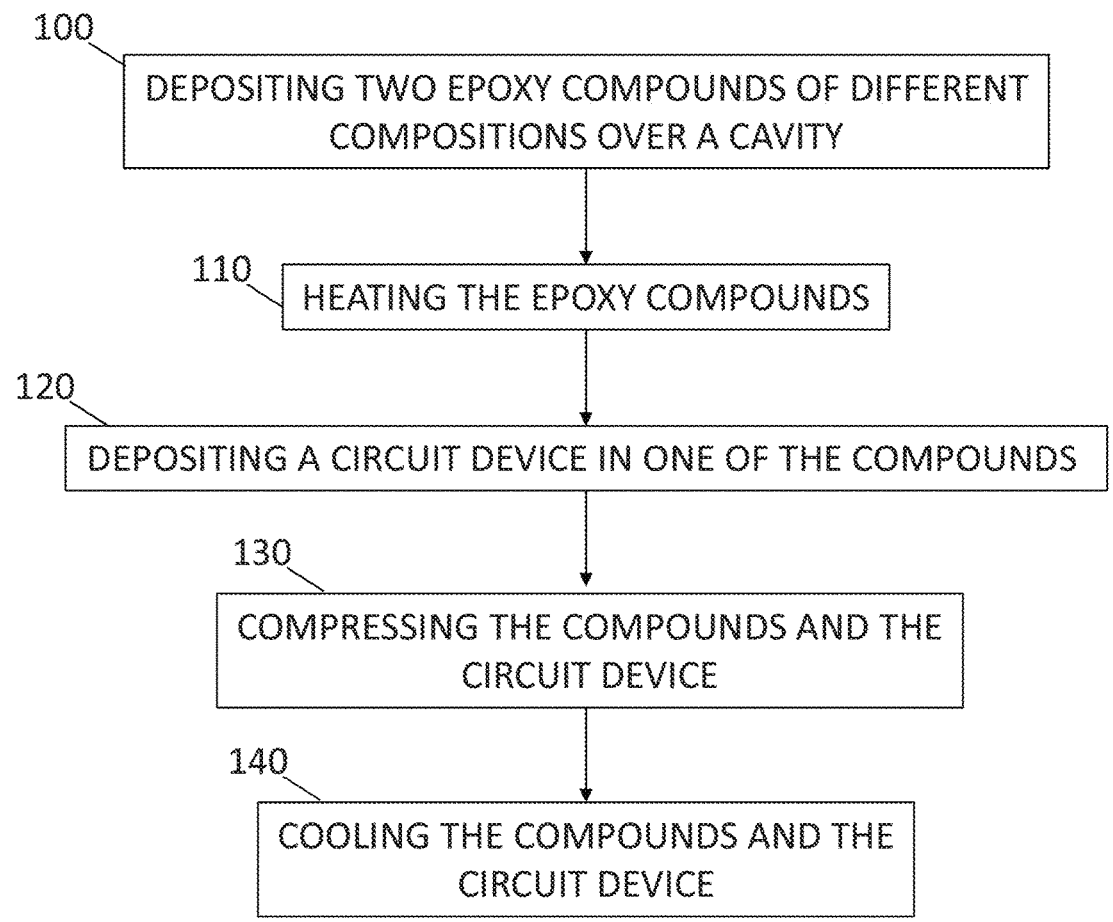
FIG. 9 illustrates a flow chart of an example of compression molding a circuit package.

The arrays 521 of nozzles may open into the front surface F of the circuit package 501 (FIG. 7). A nozzle density of one row of nozzles may for example be at least approximately 300 nozzles per inch, at least 600 nozzles per inch, at least 900 nozzles per inch, at least 1200 nozzles per inch, or more. In an example, each fluid circuit device 503 is provided with at least two nozzle arrays 521. Besides being relatively thin, in a further example, the fluidic circuit devices 503 have a relatively small width W and long length L. For example a ratio of length L versus width W may be at least approximately 25:1 or at least 50:1. The fluid circuit devices 503 may be arranged in two rows R so that subsequent nozzle arrays 521 in opposite rows R overlap so as to have continuous coverage of nozzle arrays as seen from a side direction D perpendicular to said length L of the fluid circuit devices 503, as best illustrated by FIG. 9. In one example, this continuous coverage may provide for media wide 2D or 3D printing.

The packaging 505 includes through bores in the form of fluid holes 523 to deliver fluid to each of the fluid circuit devices 503. In an example, average cross-sectional diameters of the fluid holes 523 are larger than the average cross sectional diameters of the fluid channels 519 of the devices 503. The fluid holes 523 open into the back surface B of the packaging 505 and lead to each of the fluid circuit devices 503. An array 523A of fluid holes 523 may extend into the drawing, parallel to each of the nozzle arrays 521, as illustrated by a dotted line in one of the circuit devices 503 in FIG. 9. One row of fluid holes 523 may guide fluid to two nozzle arrays 521, for example by using an intermediate manifolding channel. The fluid holes 523 may open in to such intermediate manifold channel that leads to the nozzles of both parallel nozzle arrays 521.

In an example, most of the length Lf of the fluid holes 523 extend through the first epoxy mold compound 507. For example, the fluid holes 523 extend entirely in the first epoxy mold compound 507. In another example, a final portion of the fluid holes 523, near the circuit devices 503, extend through the second epoxy mold compound 509.

The second epoxy mold compound 509 may be adapted to have various additional functions advantageous for fluidic devices. In a first example, the second epoxy mold compound 509 has a relatively high thermally conductivity, higher than the first epoxy mold compound 507. In one example, heat is generated by thermal resistor drop generators 561. The heat may be transferred partly to the fluid and partly to the structure of the circuit device 503. From there, the heat may be transferred to the second epoxy mold compound 509. The second epoxy mold compound 509 conducts the heat away from the circuit device 503, whereby the heat may be distributed over the entire second epoxy mold compound layer and exchanged with air that contacts the head surface F. Overheating can have negative effects for thermal resistors, such as impeding formed bubbles and air to be desorbed by the fluid after a firing event. Once more air is present near the actuators 557 or in the fluid channel 519, the actuators 557 may not be cooled sufficiently by the fluid, causing further overheating and malfunctioning drop generators 561. A higher thermal conductivity of the second epoxy mold compound 509 that extends adjacent the circuit devices 503 may aid in keeping the fluidic circuit device 503 sufficiently cool in operation and prevent malfunctioning drop generators 561.

In a second example, the second epoxy mold compound 509 may be electrically conductive. For example the second epoxy mold compound 509 may provide for a electromagnetic shield. In a third example, the second epoxy mold compound 509 has a relatively low surface energy. Thereby the fluids that are expelled by the drop generators 561 do not stick to the head surface F, reducing a risk that these drops would form puddles or crust on the head surface F and thereby block nozzles 551, cause smear on the media, or impede drop ejection. In a fourth example, the second epoxy mold compound 509 has a relatively high hardness as compared to the first epoxy mold compound 501.

In one example, filler properties of one of the epoxy mold compounds may be locally adjusted. For example, referring to FIG. 6, a third epoxy mold compound 571 region may be provided adjacent fluid channels or holes 523, for example forming walls of the fluid holes 523. The third epoxy mold compound 571 includes relatively smaller or finer fillers that aid in achieving a more enhanced surface smoothness when removing material to create holes, slots or channels in the compound. For example fluid channels may be created through laser ablation or other suitable remove techniques and by using these finer fillers the walls of the fluid holes 523 are relatively smooth.

FIG. 9 illustrates a flow chart of an example of a method of compression molding. The example method is further illustrated in diagrammatic drawings in FIGS. 10A and 10B. Below, block numbers refer to the flow chart of FIG. 9 and reference numbers refer to the drawings of FIGS. 10A and 10B. The method of compression molding includes depositing at least two epoxy mold compounds 807, 809 of different compositions over a mold cavity 825 (block 100, FIG. 10A). In one example, the each of the epoxy mold compounds involve granular epoxy mold compounds. In one example the different compositions may involve different compositions that result in different functionalities as explained in the examples above. The method further includes heating the compounds 807, 809 (block 110, FIG. 10A) in the cavity. The method further includes depositing at least one circuit device 803 in at least one of the epoxy mold compounds 807, 809 (block 120, FIG. 11B). The circuit device 803 may be deposited in the epoxy mold compounds 807, 809 while compressing the epoxy mold compounds 807, 809 (block 130). The method further includes cooling the circuit device 803 and the epoxy mold compounds 807, 809 (block 140, FIG. 10B).

FIG. 10A illustrates a mold cavity 825 with two layers of epoxy mold compound 807, 809, for example granular epoxy mold compounds 807, 809 or sheet mold sheets, placed in the mold cavity 825. In the illustrated example, a layer of a second epoxy mold compound 809 with extends over a layer of a first epoxy mold compound 807, wherein the layers 807, 809 have different compositional and functional properties. The layer of the first epoxy mold compound 807 may be thicker than the layer of the second epoxy mold compound 809. A mold tool 829 is to deposit the circuit devices 803 into to the heated second epoxy mold compound 809 while compressing the epoxy mold compound. In a further example, at least one mold tool 829 is to deposit multiple layers of different epoxy mold compounds of different compositions. In different examples, the mold tool can dispense different layer thicknesses, layer sequences, and pattern the compounds in an X-Y plane perpendicular to the extrusion direction, such as in the examples of FIGS. 6 and 7.

FIG. 10B illustrates a panel-shaped, cooled circuit package 801 wherein the circuit devices 803 have been deposited in the second epoxy mold compound 809. A back portion BP of the circuit package 803 is formed by the first epoxy mold compound 807. Most of the volume of the circuit packaging 805 is formed by the first epoxy mold compound 807.

In the different examples of this disclosure, the first epoxy mold compound may be an industry standard epoxy mold compound such as CEL400ZHF40WG from Hitachi Chemical, Ltd®. A thermally conductive second epoxy mold compound may be KE-G1250HT-CP from Kyocera Chemical, Ltd. For example the second epoxy mold compound may include thermally conductive particles such as magnesium oxide, aluminum nitride, beryllium oxide, or other metal oxide fillers. An example weight percentage of thermally conductive particles in the second epoxy mold compound is between approximately 60 and 90 weight percentage. In another example, the second epoxy mold compound is electrically conductive and includes carbon-based conductive particles such as carbon nanotube, graphite, or other carbon fillers. An example weight percentage of electrically conductive particles in the second epoxy mold compound is between approximately 20 and 60 weight percentage. In certain examples, the thermally conductive particles also have electrically conductive properties and the second epoxy mold compound is both electrically and thermally conductive. A second epoxy mold compound having low surface energy may include particles of fluorinated polymer additives such as PTE, PEEK or others, or hydrophobic fumed silica or TEFLON®. An example weight percentage of low surface energy inducing particles in the second epoxy mold compound is between approximately 10 and 90 weight percentage. A second epoxy mold compound having enhanced hardness may include ceramic, diamond, metal, dyes, and carbon nanotube particles in order to obtain said enhanced hardness. An example weight percentage of hardness inducing particles in the second epoxy mold compound is between approximately 10 and 40 weight percentage. In one example, the electrically conductive layer of the second epoxy mold compound is relatively thin, for example thinner than 0.3 millimeter, thinner than 0.2 millimeter, thinner than 0.1 millimeter or thinner than 500 micron, or thinner than 300 micron. Reducing the amount of second epoxy mold compound may reduce costs and/or allow the use of more costly additive particles. In this disclosure, particles may include powders, fillers, etc. that are embedded in the second epoxy mold compound.

In the various example, the second epoxy mold compound is illustrated as a top layer that provides for the head surface F. In other examples, a coating may be applied over the surface of the second epoxy mold compound, for example to add yet further functionalities.

The examples of this disclosure describe placement of a second epoxy mold compound of different properties, next to the circuit devices, for example in a bulk epoxy mold compound. Effects of the circuit packages of this disclosure may include at least one of different conductivity, different surface properties, different surface energy, increasing design space, and eliminating the need to add additional separate components or layers that may require additional manufacturing steps. Some of the examples of this disclosure allow for a generally cost efficient packaging wherein the bulk of the packaging may be obtained using cost efficient material while only specific parts of the packaging are provided with less standardized, for example more costly, properties.

Although in different examples of this disclosure, mostly epoxy mold compounds are described, other materials such as liquid epoxy, solid, pre-mold sheet, and so on may also be suitable for compression molding and/or for providing a circuit package of this disclosure The circuit package of the various examples described in this disclosure may be a subcomponent of a larger package or device, or an intermediate product of an end product. For example multiple other layers or components can be attached to the back or front surface. Hence, when the circuit package is a subcomponent, the back or front surface may not be directly visible from the outside of the assembly of which the circuit package is a subcomponent.

The various examples of circuit packages and manufacturing methods may relate to integrated circuit packaging for example for computer components. In further examples, the packages and methods may involve fluidic applications such as 2D or 3D printing, digital titration, lab-on-chip, or other MEMS or microfluidic devices.

It should be understood that the various example circuit packages of this disclosure may have any orientation: orientational terms such as "head", "back", "front", "above" or the like should be understood as illustrative only.

What is claimed is:

1. A circuit package, comprising
a packaging,
a circuit device in the packaging and having an exposed edge at a surface of the packaging, the circuit device comprising fluid channels and transistor arrays aligned to the fluid channels, and the packaging comprises fluid holes that open into the fluid channels, wherein
the packaging comprises a first epoxy mold compound with a first conductivity and a second epoxy mold compound with a second conductivity higher than the first conductivity, wherein the second epoxy mold compound forms the surface of the packaging around the exposed edge of the circuit device in the packaging.

2. The circuit package of claim 1, wherein the second epoxy mold compound has a higher thermal conductivity than the first epoxy mold compound.

3. The circuit package of claim 1, wherein the second epoxy mold compound comprises embedded particles that reduce surface energy.

4. The circuit package of claim 1, wherein the second epoxy mold compound functions as a ground.

5. The circuit package of claim 1, wherein the second epoxy mold compound comprises embedded particles to increase hardness.

6. The circuit package of claim 1 wherein the first epoxy mold compound has different filler properties than the second epoxy mold compound.

7. The circuit package of claim 1, wherein the second epoxy mold compound includes metal fillers.

8. The circuit package of claim 1, comprising an array of circuit devices.

9. The circuit package of claim 1, wherein the second epoxy mold compound forms a surface layer less than approximately 0.2 millimeters in thickness.

10. A circuit package, comprising
a packaging,
a circuit device in the packaging, the circuit device comprising a fluid ejection device having a plurality of nozzles open at a surface of the packaging, wherein
the packaging comprises a first epoxy mold compound with first surface properties and a second epoxy mold compound with second surface properties, different than the first surface properties, wherein the second epoxy mold compound forms the surface of the packaging around the nozzles of the fluid ejection device, and wherein the second epoxy mold compound has a surface energy that is lower than a surface energy of the first epoxy compound so as to limit fluid collection at the nozzles of the fluid ejection device.

11. The circuit package of claim 10, wherein the second epoxy mold compound is harder than the first epoxy mold compound.

12. The circuit package of claim 10, wherein the second epoxy mold compound comprises particles that reduce surface energy.

13. The circuit package of claim 12, wherein the particles that reduce surface energy comprise at least one of: fluorinated polymer and hydrophobic fumed silica.

14. The circuit package of claim 10, wherein the second epoxy mold compound comprises embedded particles to enhance surface hardness.

15. The circuit package of claim 10, further comprising a third epoxy mold compound disposed within the first epoxy mold compound around fluid channels formed through the first epoxy mold compound, the third epoxy mold compound having filler particles smaller than filler particles in the first epoxy mold compound or the second epoxy mold compound, the smaller filler particles increasing surface smoothness inside the fluid channels.

16. A method of compression molding, comprising
depositing first and second epoxy mold compounds of different surface energies over a cavity;
heating the first and second epoxy mold compounds;
depositing a circuit device in the second epoxy mold compound, the circuit device comprising a fluid ejection device having a plurality of nozzles; and
compressing and cooling the circuit device and the first and second epoxy mold compounds, the plurality of nozzles of the fluid ejection device open at a surface of a packaging formed by the first and second epoxy mold compounds after the compressing and cooling, wherein the second epoxy mold compound forms the surface of the packaging around the nozzles of the fluid ejection device, and wherein the second epoxy mold compound has a surface energy that is lower than a surface energy of the first epoxy compound so as to limit fluid collection at the nozzles of the fluid ejection device.

17. The method of claim 16, comprising depositing a relatively thin layer of the second epoxy mold compound over a relatively thick layer of the first epoxy mold compound.

* * * * *